(12) United States Patent
Ominami et al.

(10) Patent No.: US 9,362,083 B2
(45) Date of Patent: Jun. 7, 2016

(54) CHARGED PARTICLE BEAM APPARATUS AND SAMPLE OBSERVATION METHOD

(71) Applicant: Hitachi High-Technologies Corporation, Minato-ku, Tokyo (JP)

(72) Inventors: Yusuke Ominami, Tokyo (JP); Shinsuke Kawanishi, Tokyo (JP); Hiroyuki Suzuki, Tokyo (JP); Kohtaro Hosoya, Tokyo (JP); Masanari Furiki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/420,942

(22) PCT Filed: Jul. 8, 2013

(86) PCT No.: PCT/JP2013/068587
§ 371 (c)(1),
(2) Date: Feb. 11, 2015

(87) PCT Pub. No.: WO2014/041882
PCT Pub. Date: Mar. 20, 2014

(65) Prior Publication Data
US 2015/0221470 A1 Aug. 6, 2015

(30) Foreign Application Priority Data
Sep. 14, 2012 (JP) .................... 2012-202194

(51) Int. Cl.
*H01J 37/18* (2006.01)
*H01J 37/26* (2006.01)
(Continued)

(52) U.S. Cl.
CPC .............. *H01J 37/18* (2013.01); *H01J 37/16* (2013.01); *H01J 37/261* (2013.01); *H01J 37/28* (2013.01);
(Continued)

(58) Field of Classification Search
USPC ................ 250/305, 306, 307, 309, 310, 311, 250/492.1, 492.2, 492.3
See application file for complete search history.

(56) References Cited

U.S. PATENT DOCUMENTS 8,835,847 B2 * 9/2014 Yaguchi et al. .............. 250/311
8,878,144 B2 * 11/2014 Yaguchi et al. .......... 250/441.11
(Continued)

FOREIGN PATENT DOCUMENTS

EP 2 541 583 A1 1/2013
JP 8-50875 A 2/1996
(Continued)

OTHER PUBLICATIONS

International Search Report dated Sep. 3, 2013 with English translation (six (6) pages).
(Continued)

*Primary Examiner* — Nicole Ippolito
(74) *Attorney, Agent, or Firm* — Crowell & Moring LLP

(57) ABSTRACT

There is provided a charged particle beam apparatus having the function of permitting observation of a sample in a gas atmosphere or in a liquid state, the apparatus being intended to let a dry sample be observed as it is getting saturated with an introduced liquid and to prevent a charged particle beam from getting scattered by an unwanted liquid introduced between a diaphragm and the sample. This invention provides a structure including an inlet-outlet part (300) that brings in and out a desired liquid or gas in the direction of the underside or the side of the sample (6), the structure being arranged so that the sample (6) is irradiated with a primary charged particle beam while the sample (6) and the diaphragm (10) are kept out of contact with each other.

17 Claims, 13 Drawing Sheets

(51) Int. Cl.
  *H01J 37/16* (2006.01)
  *H01J 37/28* (2006.01)
  *H01J 37/20* (2006.01)

(52) U.S. Cl.
  CPC .......... *H01J 37/20* (2013.01); *H01J 2237/1825* (2013.01); *H01J 2237/2448* (2013.01); *H01J 2237/2602* (2013.01); *H01J 2237/2605* (2013.01)

(56) References Cited

U.S. PATENT DOCUMENTS

| | | |
|---|---|---|
| 2004/0046120 A1 | 3/2004 | Moses et al. |
| 2005/0045821 A1* | 3/2005 | Noji .................... G01N 23/225 250/311 |
| 2009/0166536 A1 | 7/2009 | Suga et al. |
| 2010/0243888 A1 | 9/2010 | Nishiyama et al. |
| 2012/0305769 A1 | 12/2012 | Yaguchi et al. |

FOREIGN PATENT DOCUMENTS

| | | |
|---|---|---|
| JP | 2004-515049 A | 5/2004 |
| JP | 2005-174657 A | 6/2005 |
| JP | 2006-147430 A | 6/2006 |
| JP | 2009-129799 A | 6/2009 |
| JP | 2009-158222 A | 7/2009 |
| JP | 2011-175809 A | 9/2011 |
| WO | WO 02/45125 A1 | 6/2002 |
| WO | WO 2010/001399 A1 | 1/2010 |
| WO | WO 2011/104801 A1 | 9/2011 |

OTHER PUBLICATIONS

English translation of German Office Action dated Apr. 7, 2015 (three (3) pages).

* cited by examiner

F I G . 2
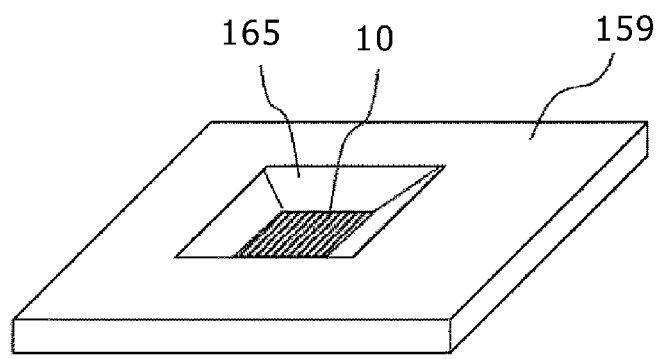

FIG. 5
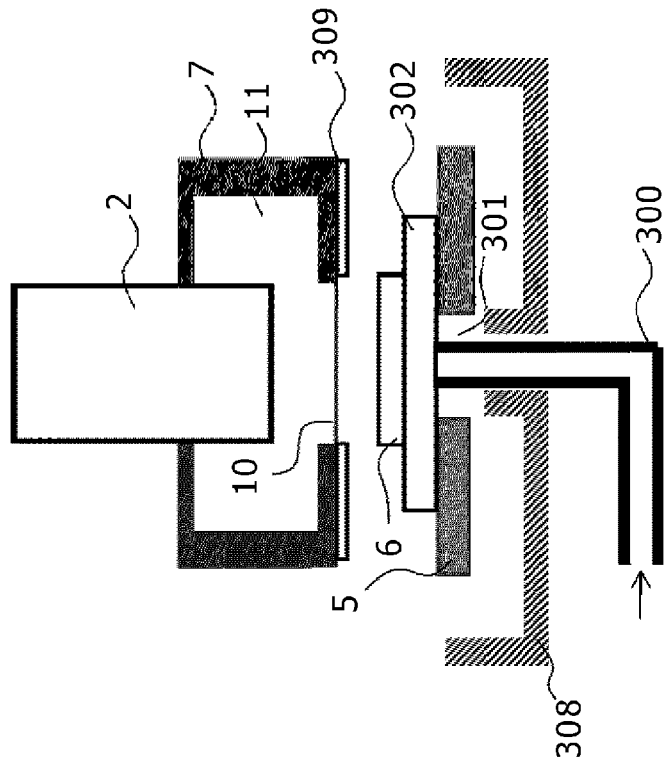
(a)
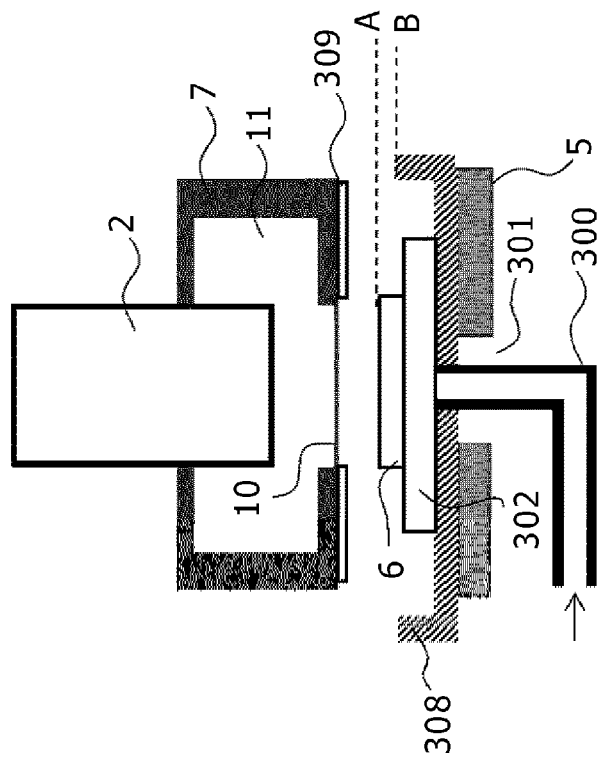
(b)

FIG. 6
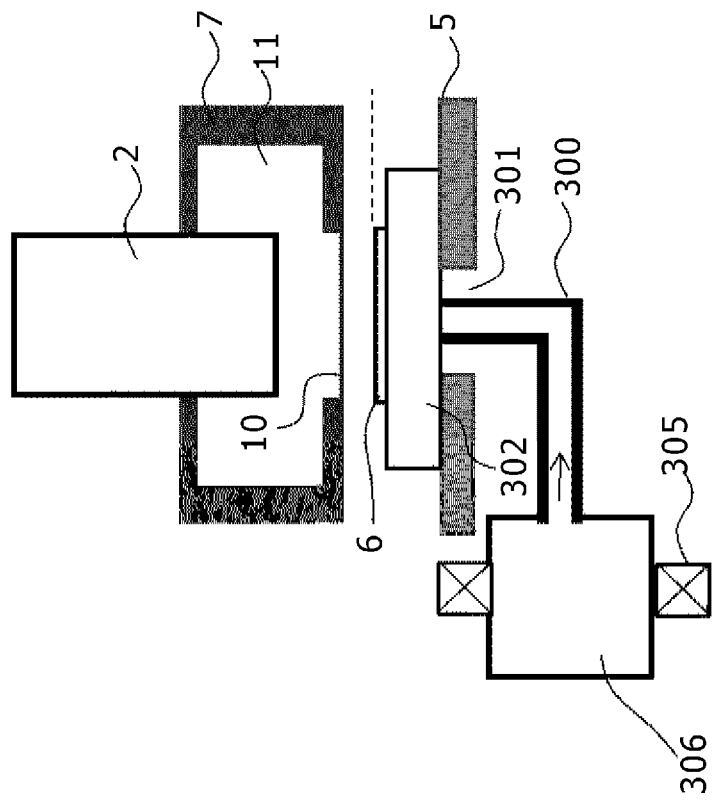
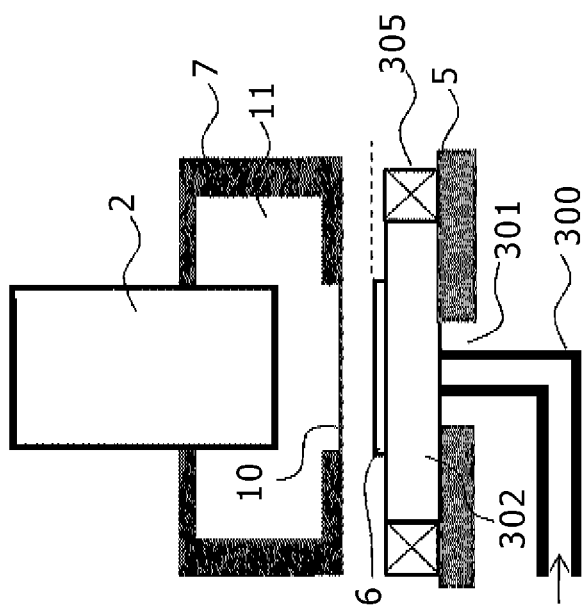

CHARGED PARTICLE BEAM APPARATUS AND SAMPLE OBSERVATION METHOD

TECHNICAL FIELD

The present invention relates to a microscope technology that permits observation in a gas atmosphere at atmospheric pressure or under a predetermined pressure.

BACKGROUND ART

Scanning electron microscopes (SEM) or transmission electron microscopes (TEM) are used to observe infinitesimal regions of an object. Generally, these devices evacuate an enclosure that houses a sample to get images of the sample in a vacuum state. However, biochemical samples or liquid samples can be damaged in vacuum or can be changed in nature therein. Meanwhile, there has been a strong need for observing such samples under electron microscope. In recent years, there have been developed SEM equipment and sample holding devices that allow an observation target sample to be observed at atmospheric pressure.

In principle, these devices set up a permeable diaphragm or a tiny through hole that allows an electron beam to pass therethrough between an electron optical system and the sample, thereby separating the vacuum state from the atmospheric state. Common to these devices is the provision of the diaphragm between the sample and the electron optical system.

For example, Patent Document 1 discloses an SEM in which an electron optical tube has its electron source oriented downward and its objective lens oriented upward. The end of the electron optical tube emitting an electron beam has a diaphragm with an O-ring allowing the electron beam to pass through an emitting hole of the tube. According to the invention described in this literature, the observation target sample is directly placed on the diaphragm. The sample is then irradiated from below with a primary electron beam so that reflected or secondary electrons are detected for SEM observation. The sample is held in a space made up of the diaphragm and a circular member surrounding the diaphragm. Furthermore, this space is filled with liquid such as water.

Patent Document 2 discloses the invention of an environmental cell in which an observation sample is placed inside a cylindrical vessel whose upper surface part has a diaphragm for letting an electron beam pass therethrough. The cylindrical vessel, installed in a vacuum sample chamber of an SEM, is connected with a hose from outside the chamber to maintain the vessel interior in an air atmosphere.

PRIOR ART LITERATURE

Patent Document

Patent Document 1: JP-2009-158222-A (U.S. Unexamined Patent Application Publication No. 2009/0166536)
Patent Document 2: Japanese Unexamined Patent Application Publication (Translation of PCT Application) No. 2004-515049 (International Unexamined Patent Application No. 2002/045125)

SUMMARY OF THE INVENTION

Problems to be Solved by the Invention

Ordinary charged particle beam apparatuses offering the function of permitting observation of the sample in a gas atmosphere or in a liquid state have been incapable of allowing a dry sample to be observed as it is being saturated with an introduced liquid.

Also, in the apparatus described in Patent Documents 1 and 2, the intrusion of the liquid between the sample and the diaphragm is unavoidable. The problem in this case is that the electron beam tends to be scattered by the liquid, so that the beam may not reach the sample to be actually observed. That is, only that portion of the sample that is fully in contact with the diaphragm can be observed.

Another problem is that because the liquid is continuously in contact with the diaphragm, the diaphragm is highly likely to break.

As explained above using examples, the ordinary charged particle beam apparatuses have had only insufficient means for introducing a liquid or a gas into the surroundings of the sample and permitting observation of that sample.

The present invention has been made in view of the above circumstances and provides a charged particle beam apparatus that permits observation of a sample in an air atmosphere, in a vacuum state, in a desired liquid, or in a desired gas atmosphere, the charged particle beam apparatus further allowing the desired liquid or gas to be brought into and out of the inside or the surroundings of the sample.

Means for Solving the Problem

To solve the above-described problem, there may be adopted, for example, the structures described in the appended claims of this application.

This application includes multiple means for solving the above-described problem, one such means including an inlet-outlet part that brings in and out a desired liquid or gas in the direction of the lower or side surface of a sample which, kept out of contact with a diaphragm, is irradiated with a primary charged particle beam.

Effects of the Invention

According to the present invention, there is provided a charged particle beam apparatus that allows a sample to be observed in an air atmosphere, in a vacuum state, in a desired liquid, or in a desired gas atmosphere, the charged particle beam apparatus further allowing the desired liquid or gas to be brought into and out of the inside or the surroundings of the sample.

Further problems, structures, and advantages other than those stated above will become apparent upon a reading of the ensuing explanation of some embodiments of the present invention.

BRIEF DESCRIPTION OF THE DRAWINGS

FIG. 2 is a detail plan of a diaphragm.

FIGS. 5A and 5B are further diagrams explaining the typical structure of the charged particle microscope as the first embodiment.

FIGS. 6A and 6B are further diagrams explaining the typical structure of the charged particle microscope as the first embodiment.

MODE FOR CARRYING OUT THE INVENTION

Some embodiments of the present invention will now be explained with reference to the accompanying drawings.

What follows is an explanation of charged particle beam microscopes as an example of the charged particle beam apparatus. It should be noted that these microscopes are only an example embodying the present invention and that the invention is not limited to the embodiments to be discussed hereunder. The present invention can be applied to scanning electron microscopes, scanning ion microscopes, scanning transmission electron microscopes, a composite device that combines any of these microscopes with sample processing equipment, or analyzer/inspection equipment that applies any of these microscopes.

In this description, the wording "atmospheric pressure" refers to an air atmosphere or a predetermined gas atmosphere and signifies a pressure environment under atmospheric pressure or in a somewhat negatively or positively pressured state. Specifically, the environment is to be at about $10^5$ Pa (atmospheric pressure) to about $10^3$ Pa.

First Embodiment
<Basic Structure of the Apparatus>

Figure 1:
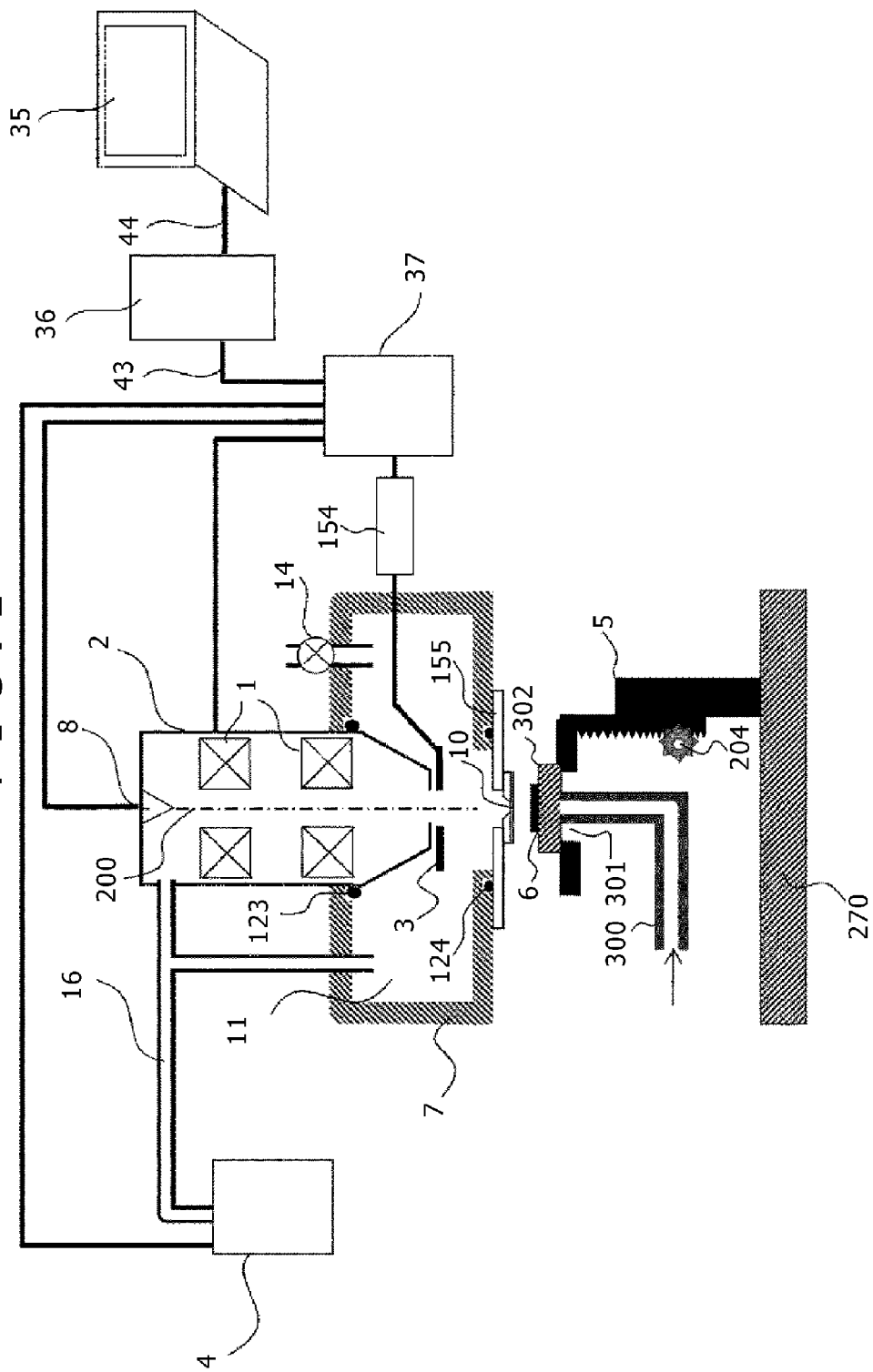
FIG. 1 is an overall block diagram of a charged particle microscope as a first embodiment of the present invention.

The first embodiment is explained here as the most basic mode for carrying out the invention. FIG. 1 is an overall block diagram of a charged particle microscope as the first embodiment. The charged particle microscope shown in FIG. 1 is mainly constituted by a charged particle optical tube 2, an enclosure (vacuum chamber) 7 connected to and supporting the charged particle optical tube, a sample stage 5 placed in an air atmosphere, and a control system that controls these components. When the charged particle microscope is to be used, the inside of the charged particle optical tube 2 and that of the first enclosure are evacuated by a vacuum pump 4. The control system also controls the start and stop of the vacuum pump 4. Although only one vacuum pump is shown, two or more vacuum pumps may be provided alternatively. It is assumed that the charged particle optical tube 2 and the enclosure 7 have columns or like parts, not shown, that are supported by a base 270.

The charged particle optical tube 2 is made up of such elements as a charged particle source 8 that generates a charged particle beam, and an optical lens 1 that focuses the generated charged particle beam at the bottom of the tube as a primary charged particle beam for scanning the sample 6. The charged particle optical tube 2 is positioned in a manner protruding into the enclosure 7 and fixed to the enclosure 7 by means of a vacuum sealing member 123. The tip of the charged particle optical tube 2 has a detector 3 that detects secondary particles (secondary or reflected electrons) stemming from irradiation with the primary charged particle beam.

The charged particle microscope of the first embodiment has the control system that includes a computer 35 used by an apparatus user, a master control unit 36 connected with the computer 35 to conduct communications, and a slave control unit 37 that controls an evacuation system and a charged particle optical system, among others, under instructions from the master control unit 36. The computer 35 has a monitor that displays an apparatus operation screen (GUI) and input means such as a keyboard and a mouse for making entries into the operation screen. The master control unit 36, slave control unit 37, and computer 35 are interconnected by communication lines 43 and 44.

The slave control unit 37 is a unit that sends and receives control signals for controlling the vacuum pump 4, charged particle source 8, and optical lens 1. Also, the slave control unit 37 converts the output signal from the detector 3 into a digital image signal before transmitting the signal to the master control unit 36. In FIG. 1, the output signal from the detector 3 is connected to the slave control unit 37 via an amplifier 154 such as a preamplifier. The signal amplifier may be omitted if unnecessary.

In the master control unit 36 and slave control unit 37, both analog and digital circuits may coexist. The master control unit 36 and slave control unit 37 may alternatively be unified into a single unit. It should be noted that the structure of the control system shown in FIG. 1 is only an example and that variations of the control units, valves, vacuum pumps, communication wiring, etc., fall within the scope of the SEM or charged particle beam microscope of the first embodiment as long as such variations fulfill the functions intended by this embodiment.

The enclosure 7 is connected with vacuum piping 16 of which one end is coupled to the vacuum pump 4, so that the inside of the enclosure 7 is kept in a vacuum state. Also, the enclosure 7 has a leak valve 14 that exposes the interior of the enclosure 7 to the atmosphere. At the time of maintenance, the leak valve 14 can expose the inside of the enclosure 7 to the atmosphere. Installation of the leak valve 14 is optional. There may be two or more leak values 14 installed. Installation of the leak valve 14 on the enclosure 7 is not limited to the location shown in FIG. 1; the valve may be located elsewhere on the enclosure 7.

The underside of the enclosure is provided with a diaphragm 10 that is positioned immediately under the charged particle optical tube 2. The diaphragm 10 allows the primary charged particle beam discharged from the lower end of the charged particle optical tube 2 to permeate or pass therethrough. Past the diaphragm 10, the primary charged particle beam ultimately reaches the sample 6. A closed space formed by the diaphragm 10 may be evacuated. Thus the first embodiment can maintain the charged particle optical tube 2 in a vacuum state and the sample 6 at atmospheric pressure. Also, the sample 6 can be replaced freely during observation.

<Diaphragm Part>

FIG. 2 is a detail plan of the diaphragm 10. The diaphragm 10 is formed or deposited on a base 159. The diaphragm 10 is made of a carbon material, an organic material, silicon nitride, silicon carbide, or silicon oxide. The base 159 is a member made of silicon for example, and has a tapered hole 165 formed typically by wet etching as illustrated. The diaphragm 10 is positioned at the bottom as shown in FIG. 2. The diaphragm 10 may be formed by multiple windows. The diaphragm that allows the primary charged particle beam to permeate or pass therethrough is to have a thickness of approximately several nm to several μm. In place of the diaphragm, there may be provided an aperture member having a hole that lets the primary charged particle beam pass therethrough. In this case, the hole should preferably be 1 mm² or less in area in view of the requirement that a commonly available vacuum pump be capable of differential evacuation. As long as a vacuum pressure difference can be generated and maintained between the upper and lower side of the diaphragm 10, the diaphragm 10 may have infinitesimal holes formed therein.

However, if the diaphragm part 10 is composed of multiple windows, there is an increased possibility that the sample may inadvertently come into contact with the diaphragm and break the latter. Thus the diaphragm 10 may be provided only as a single part.

The diaphragm is required not to break because of the difference in pressure between atmospheric pressure and vacuum. This means that the area of the diaphragm should range from tens of μm to several mm at most. The shape of the diaphragm 10 is not limited to a square; the diaphragm may also have some other shape such as a rectangle. In fact, the diagram may be shaped in any suitable manner. The side shown in FIG. 2, i.e., the side where the tapered part 165 is provided is arranged to be on the vacuum side (upper side in the drawing). This arrangement is intended for the detector 3 efficiently to detect secondary charged particles released from the sample.

Having reached the sample 6 after permeating or passing through the diaphragm 10, the charged particle beam causes secondary particles such as reflected or permeated charged particles to be discharged from the surface or from inside of the sample. The detector 3 detects the secondary particles. The detector 3 is a detecting element capable of detecting and amplifying charged particle beams emitted with several to tens of keV of energy. For example, the detecting element may be a semiconductor detector made of a semiconductor material such as silicon, or may be a scintillator capable of converting charged particle signals into light internally or by use of its glass surface.

Under the diaphragm 10 attached to the enclosure 7 is the sample stage 5 placed in the air atmosphere. The sample stage 5 is furnished with a height adjustment mechanism that allows at least the sample 6 to approach the diaphragm 10. Rotating an operation part 204, for example, enables the sample 6 to move toward the diaphragm 10. Obviously, the sample stage 5 may also have an X-Y drive mechanism that moves the sample in the plane direction.

According to the existing techniques such as the environmental cell that can locally maintain an air atmosphere, it is possible to observe the sample in an air or gas atmosphere only if the sample is small enough to be inserted into the cell. Larger samples cannot be observed in the air/gas atmosphere. Moreover, in the case of the environmental cell, observing different samples requires performing a troublesome sample replacement procedure. That is, the environmental cell is required to be extracted from the vacuum sample chamber of the SEM and, with the current sample replaced by a new sample, again brought into the vacuum sample chamber. By contrast, according to the method of the first embodiment, the space in which the sample is placed is left open so that the sample 6 as large as a semiconductor wafer can be observed at atmospheric pressure. Furthermore, the sample may be moved freely and replaced easily during observation.

According to another existing technique that involves having the sample held on the upper part of the diaphragm soaked in liquid, the diaphragm is constantly in contact with the liquid so that it is highly liable to break. By contrast, according to the method of this embodiment, the sample is not placed on the diaphragm so that the diaphragm is less likely to be damaged.

<Liquid or Gas Inlet-Outlet Part>

Figure 3:
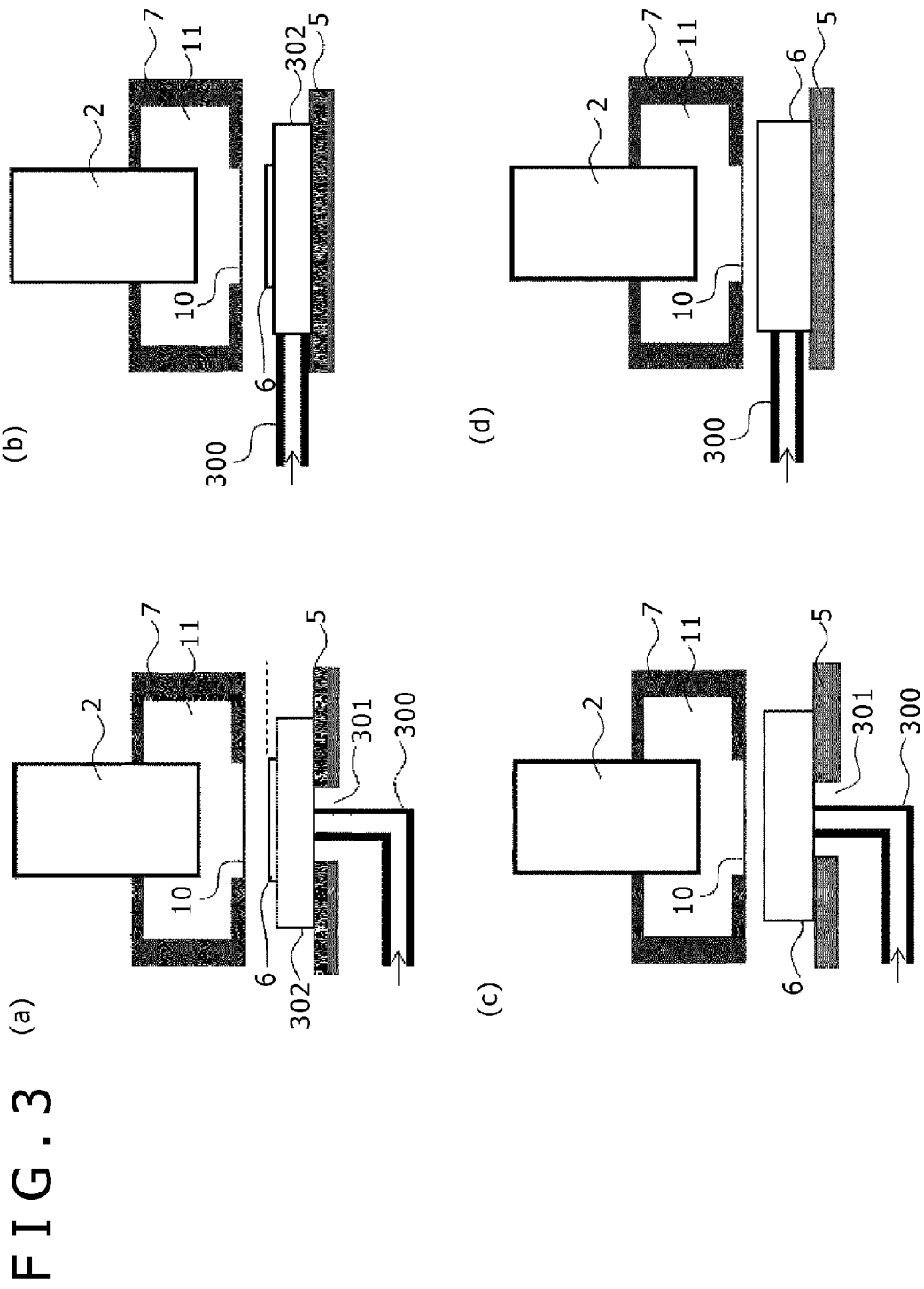
FIGS. 3A-3D are sets of diagrams explaining a typical structure of the charged particle microscope as the first embodiment.

What follows is an explanation of the most basic mode in which liquid is brought to the sample. FIG. 3 is a set of explanatory diagrams in which the charged particle optical tube 2 is not shown. With reference to FIG. 3(a), there is explained a structure in which a liquid inlet-outlet part 300 including a liquid transmission member 302 and an aperture 301 is installed under the sample on the sample stage 5. The sample is placed on the liquid transmission member 302. The liquid transmission member 302 is a member made of a porous body, a fibrous material such as filter paper, a sponge, an aperture material having at least one hole, or a multitubular body having many tubes allowing liquid or gas to permeate therethrough. The liquid transmission member 302 is close to or in contact with the liquid inlet-outlet part 300. For example, if a liquid is allowed to flow through the liquid inlet-outlet part 300 in the arrowed direction in the drawing, the liquid is brought to the liquid transmission member 302. This causes the sample 6 to be moistened from under the sample surface indicated by a dotted line in the drawing.

The sample may be a biological sample such as cells, a fibrous material such as cotton, or a soft material such as an organic material. Alternatively, the sample may be an inorganic material of which the surface structure or some other portion will change in status when moistened with liquid.

The liquid to be introduced may be water, a water solution, an organic solvent such as ethanol, or an ionic liquid.

FIG. 3(b) shows how the liquid inlet-outlet part 300 is laterally brought close to or into contact with the liquid transmission member 302. Where the liquid transmission member 302 is sufficiently thick, this structure may be adopted.

The liquid transmission member 302 may be fixed onto the sample stage 5 using, say, a metal member, an adhesive or a tape, not shown. The sample 6 may also be fixed onto the liquid transmission member 302 by use of some suitable member.

If the sample 6 is sufficiently large, it may be placed directly on the sample stage 5. In this case, as shown in FIG. 3(c), the liquid may be brought in and out through the liquid inlet-outlet part 300 by way of the aperture 301 under the sample 6. If the sample is sufficiently thick, the liquid inlet-outlet part 300 may be laterally brought close to or into contact with the sample 6 as shown in FIG. 3(d).

Below is an explanation of the procedure by which, with the sample irradiated with the charged particle beam, a liquid is brought to the sample to moisten it. Although the explanation will involve the use of the structure of FIG. 3(a) as an example, the same procedure can also apply to the structures of FIG. 3(b) through 3(d). First, the sample 6 is placed on the liquid transmission member 302. The liquid transmission member 302 together with the sample 6 is then mounted on the sample stage 5. The sample stage 5 is driven to make the sample 6 approach the diaphragm 10. Next, the sample 6 is irradiated with the charged particle beam. The liquid inlet-outlet part 300 is then brought close to or into contact with the liquid transmission member 302. If the liquid inlet-outlet part 300 has already been brought close to or into contact with the liquid transmission member 302, this operation is unnecessary. The liquid inlet-outlet part 300 is then used to bring the liquid to the liquid transmission member 302. Thereafter, with the sample 6 kept out of contact with the diaphragm 10, the sample is irradiated with the primary charged particle beam. These operations allow the sample 6 to be observed as it is being moistened over time.

The flow rate of the liquid used through the liquid inlet-outlet part 300 or the speed at which to bring in and out the liquid, and the timing of bringing in and out the liquid maybe controlled by means of an electric liquid inlet-outlet device that uses an electric pump, or by hand using a syringe. Under such control, it is possible to observe the sample 6 in the desired state in which the sample is being moistened or dried at a regulated rate.

The liquid inlet-outlet part 300 may be a tubular material such as a nozzle or a straw capable of feeding a liquid. The liquid inlet-outlet part 300 may be secured to the sample stage 5 or removably attached thereto. Alternatively, the liquid inlet-outlet part 300 may be a spoon-like part used to carry several drops of liquid. The steps involved in this case may be as follows: the liquid is put on the spoon outside the apparatus; the liquid-carrying spoon is brought close to the sample; and the sample is brought into contact with the liquid. As another alternative, outside the apparatus, the liquid may be brought into contact with a portion of the sample below the sample surface to be irradiated with the charged particle beam. The sample may then be placed under the diaphragm and irradiated with the charged particle beam. As long as the liquid can be brought to a portion of the sample from under its surface that is to be irradiated with the charged particle beam (e.g., from the bottom or the side of the sample), the liquid-introducing procedure is acceptable.

If a nozzle through which to introduce liquid from outside the apparatus is not permanently provided on the apparatus, the spot of the sample desired to be observed is first verified with the charged particle beam microscope. The sample holder is then brought outside to let the liquid be introduced by way of the liquid transmission member 302 under the sample. After this, the sample holder is put back onto the stage for another observation. If the apparatus has the nozzle through which the liquid is introduced from the outside, a liquid or a gas may be brought into and out of the apparatus while charged particle beam irradiation is underway. This allows the sample to be observed as it is being moistened in real time.

With any of the methods above, it is possible to control automatically or manually the flow rate of the liquid or gas brought in and out through the inlet-outlet part, the speed at which to bring in and out the liquid or gas, or the timing of bringing in and out the substance. Where an inlet-outlet control unit such as an electric pump is used to perform these controls automatically, the unit is easier to use if it is removably installed.

When the above-mentioned liquid inlet-outlet part is utilized, the sample can be irradiated with the charged particle beam while being kept out of contact with the diaphragm. This makes it possible to observe the sample held in an air or gas atmosphere while it is in a soaked state, being moistened, or being dried.

Figure 4:
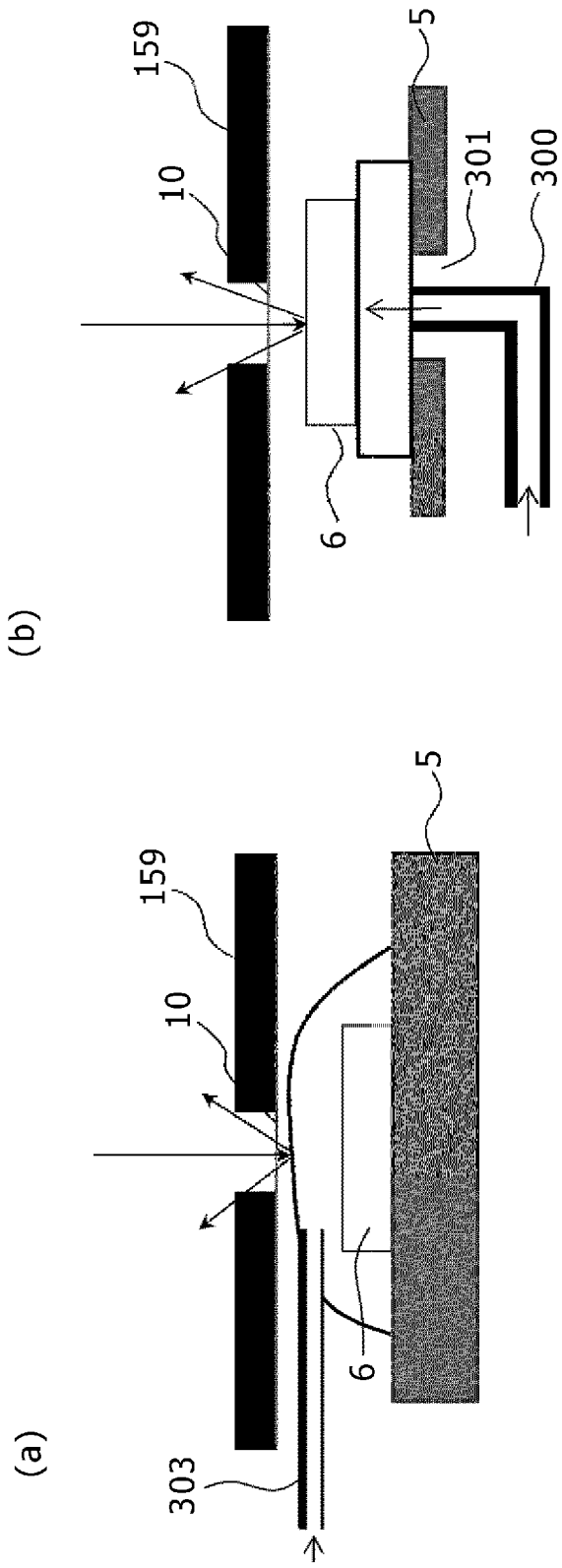
FIGS. 4A and 4B are further diagrams explaining the typical structure of the charged particle microscope as the first embodiment.

What follows is an explanation of the reason why the sample is moistened with liquid from below the sample surface that is irradiated with the charged particle beam. If the liquid is introduced from above the sample using a nozzle 303 or the like as shown in FIG. 4(a), unwanted liquid is let in between the diaphragm and the sample. The charged particle beam 10 passing through the diaphragm 10 is then scattered by the liquid before reaching the surface of the sample 6, so that the sample 6 cannot be observed. There is also fear that the liquid may come into contact with the diaphragm 10. By contrast, when the liquid inlet-outlet part 300 is introduced from below the sample surface to be irradiated with the charged particle beam, the sample 6 can be moistened without getting unwanted liquid introduced between the diaphragm 10 and the sample 6. Also, the sample 6 and the diaphragm 10 may be kept out of contact with each other. In the above-described structure where the amount and the speed of the liquid introduced through the liquid inlet-outlet part 300 are allowed to be controlled, the rate at which the sample is moistened may be controlled to a certain extent.

Where the liquid transmission member 302 is used as shown in FIG. 3(a), the sample 6 is moistened indirectly. This makes it possible to inject the liquid into the sample at a lower rate than before.

The preceding paragraphs have discussed how the liquid only is transmitted to the sample. On the other hand, moisture may be sucked out of a previously moistened sample 6 through the liquid inlet-outlet part 300. That is, the moistened sample 6 may be allowed gradually to dry. In this case, a pump or like part capable of sucking out moisture need only be attached to the liquid inlet-outlet part 300. To suck out moisture requires that the sample 6 be left on the sample stage 5. If the sample 6 to be observed is particulate such as powder, the liquid can be sucked out by placing under the sample 6 the liquid transmission member 302 such as mesh or filter paper that has numerous infinitesimal holes each smaller than each sample particulate. If the sample 6 to be observed is sufficiently large, the sample 6 may be brought close to or into direct contact with the liquid inlet-outlet part 300, so that the liquid may be sucked out of the sample.

Whereas the preceding paragraphs have discussed solely how liquid is brought in and out through the liquid inlet-outlet part 300, a gas may be handled thereby instead. A jet of a desired gas may be locally applied to or sucked from the vicinity of the sample 6. In this description, the term "liquid" refers to a wide range of fluids including viscous fluids, dispersion fluids such as gel and sol, colloids, and soft matter.

<Liquid Leak Prevention Part>

There is a possibility that the liquid may leak to locations other than the sample 6 and liquid transmission member 302. To prevent such eventuality, a liquid leak prevention part 308 may be mounted on the sample stage as shown in FIG. 5(a). The liquid leak prevention part 308 is shaped like a dish so that even if an unexpected liquid comes flowing near the sample 6, the liquid is prevented from flowing down toward the sample stage 5. However, the height A (in the drawing) at the sample surface should be above the height B of the liquid leak prevention part 308 so that the liquid leak prevention part 308 will not interfere while the surface sample is made to approach the diaphragm 10.

In the drawing, the liquid leak prevention part 308 and the liquid inlet-outlet part 300 are in tight contact with each other. Alternatively, a suitable member such as packing may be interposed between the liquid leak prevention part 308 and the liquid inlet-outlet part 300 for liquid leak prevention.

As shown in FIG. 5(b), the liquid leak prevention part 308 may be installed under the upper surface side of the sample stage 5. The liquid leak prevention part 308 may be shaped and located in any way desired and still falls within the scope of the charged particle beam apparatus of the first embodiment as long as the liquid leak prevention part 308 prevents inadvertent liquid spills and as long as the functions intended by this embodiment are satisfied.

If a large amount of liquid is inadvertently brought to the surroundings of the sample 6, the liquid may stick to the diaphragm 10. To prevent the liquid from sticking to the diaphragm 10 as much as possible, there may be provided, in the vicinity of the diaphragm 10, a liquid absorption member 309 made of a fibrous material such as filter paper or sponge (as shown in FIG. 5). This allows the liquid absorption member 309 to absorb the liquid off the sample before the liquid comes into contact with the diaphragm 10. There may also be provided an extra liquid suction port. The fibrous material such as filter paper or sponge is assumed to be replaceable.

Also, to prevent the liquid from sticking to the diaphragm 10 as much as possible, a coat of hydrophobic material may be applied to the atmospheric side of the diaphragm 10 (i.e., lower side in the drawing facing the sample). The applied material prevents the liquid brought to the diaphragm from sticking thereto, so that the liquid can be absorbed by the liquid absorption member 309.

<Voltage Impression Part>

Explained next with reference to FIG. 6(a) is the structure in which a temperature control part is installed near the sample 6. The drawing shows how a temperature control part 305 is mounted on the sample stage 5. The temperature control part 305 may be a heater capable of heating the sample or a Peltier device capable of cooling the sample. Although not shown, a thermometer may be provided to measure the temperature in the vicinity of the sample 6. The temperature control part 305 may be provided not in the surroundings of the liquid transmission member 302 but above or below it. If it is desired to heat the sample 6, the temperature control part 305 should preferably be located as close to the sample 6 as possible.

Explained with reference to FIG. 6(b) is the structure in which the temperature of a liquid or a gas, not of the sample, is desired to be controlled. The liquid inlet-outlet part 300 has a tank 306 that accommodates the liquid or gas. The tank 306 is furnished with the temperature control part 305. It is thus possible to bring the liquid or gas controlled in temperature by the temperature control part 305 to and from the vicinity of the sample. Although not shown, the temperature control part 305 may be attached to the liquid inlet-outlet part 300 that brings in and out the liquid or gas. With the tank 306 thus provided, a desired liquid may be brought to and from the sample 6 by use of an electric pump or like part, not shown.

Figure 7:
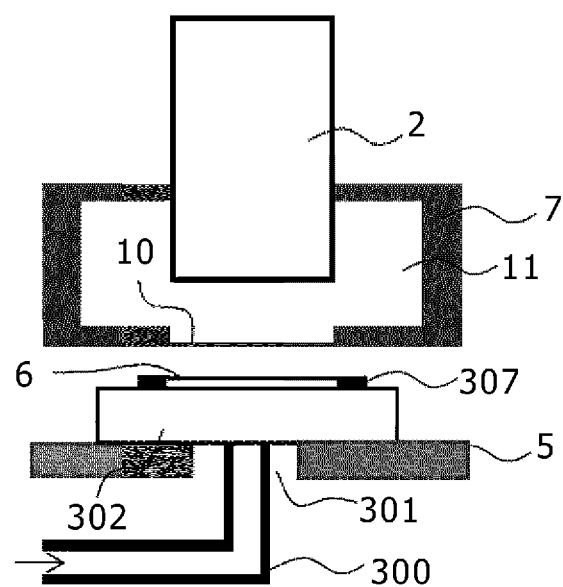
FIG. 7 is a diagram explaining the typical structure of the charged particle microscope as the first embodiment.

As shown in FIG. 7, there may be provided, near the sample, electrodes 307 that impress a voltage to the sample. This structure makes it possible to emit the charged particle beam to the sample 6 to and from which the desired liquid or gas is brought and to which the voltage is impressed.

Second Embodiment

What follows is an explanation of an apparatus structure that enables the ordinary charged particle beam apparatus easily to permit observation of the sample in the atmosphere.

Figure 8:
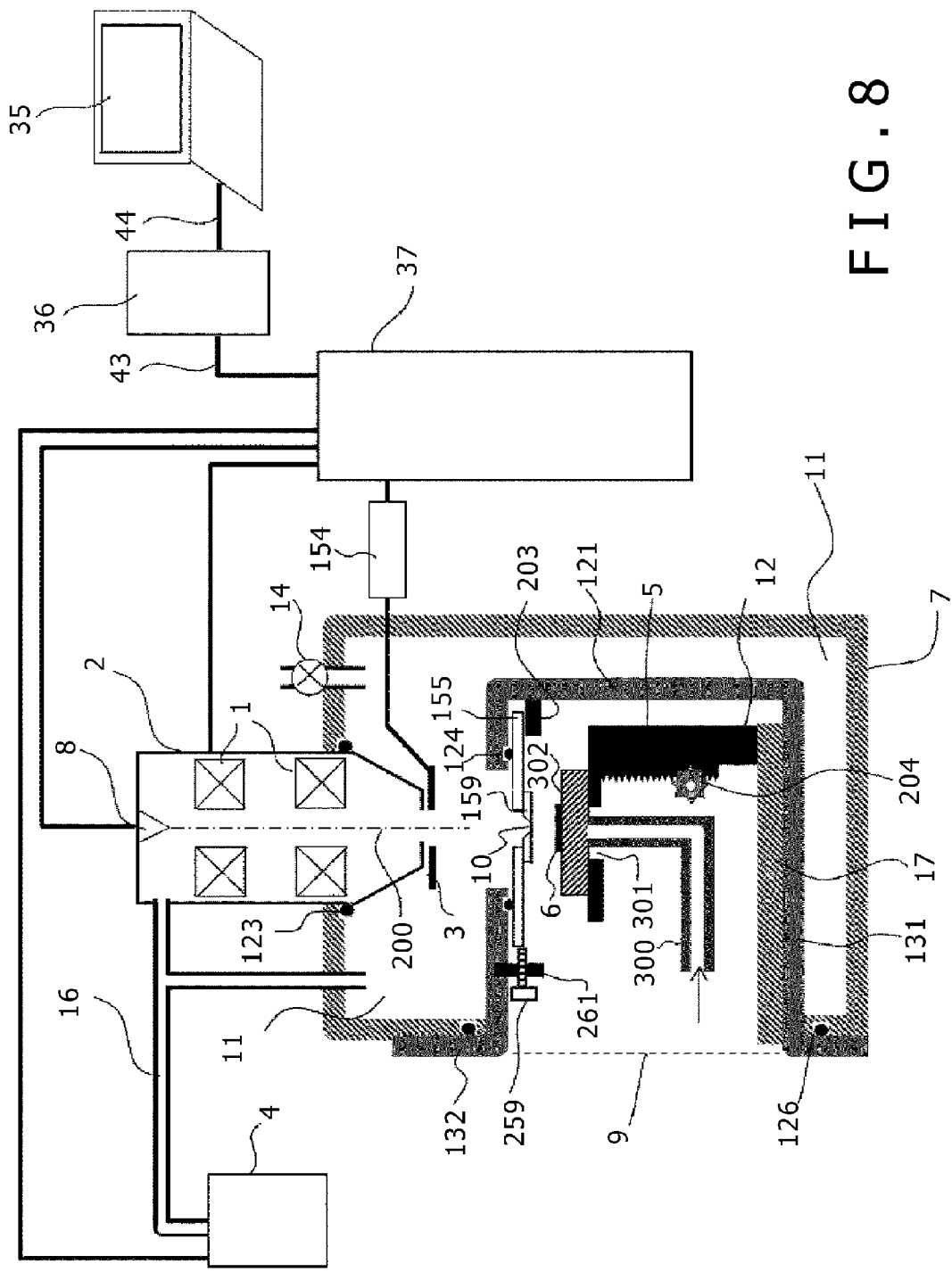
FIG. 8 is an overall block diagram of a charged particle microscope as a second embodiment of the present invention.

FIG. 8 is an overall block diagram of a charged particle microscope as the second embodiment. As with the first embodiment, the charged particle microscope of the second embodiment is made up of a charged particle optical tube 2, an enclosure (vacuum chamber) 7 that supports the charged particle optical tube against an apparatus installation surface, a sample stage 5, and a liquid inlet-outlet part 300. The operations and functions of the components involved as well as the elements added thereto are substantially the same as those of the first embodiment and thus will not be discussed further in detail.

<About the Second Enclosure>

This structure includes a second enclosure (attachment) inserted into the enclosure 7 (called the first enclosure hereunder) when used. The second enclosure 121 is composed of a cuboid-shaped main unit 131 and a matching unit 132. At least one side of the main unit 131 as the cuboid is an open side 9, as will be discussed later. Except for one of the sides of the cuboid-shaped main unit 131 to which a diaphragm holding member 155 is attached, the sides of the main unit 131 may be formed by the walls of the second enclosure 121. Alternatively, the second enclosure 121 may be devoid of its own walls. Instead, the second enclosure 121 may be formed by the sidewalls of the first enclosure 7 into which the second enclosure 121 is built. The second enclosure 121 is positionally fixed either to one side or inner wall surface of the first enclosure 7 or to the charged particle optical tube. The main unit 131 has the function of storing the sample 6 to be observed, and is inserted into the first enclosure 7 through the above-mentioned opening. The matching unit 132 has a matching surface against the outer wall surface of the side on which the opening of the first enclosure 7 is provided, and is fixed to that outer wall surface by means of a vacuum sealing member 126. In this manner, the second enclosure 121 as a whole is fit into the first enclosure 7. The above-mentioned opening is formed most simply by utilizing the opening that is intrinsically provided to the vacuum sample chamber of the charged particle microscope and is used for bringing in and out the sample. That is, the second enclosure 121 may be manufactured in a manner conforming to the size of the existing hole of which the circumference may be furnished with the vacuum sealing member 126. In this manner, the effort to remodel the apparatus can be minimized. Also, the second enclosure 121 may be detached from the first enclosure 7.

One side of the second enclosure 121 is the open side 9 communicating with the air atmosphere and large enough to at least bring in and out the sample therethrough. The sample 6 housed inside the second enclosure 121 (a space to the right of the dotted line in FIG. 1, called the second space hereunder) is in an atmospheric state during observation. Incidentally, although FIG. 8 is a sectional view of the apparatus in parallel with the optical axis and shows only one open side 9, there may be more than one open side 9 for the second enclosure 121 as long as the opening is vacuum-sealed by those sides of the first enclosure in the depth and at the front of FIG. 8. There need only be at least one open side where the second enclosure 121 is built into the first enclosure 7. Meanwhile, the vacuum pump 4 is connected to the first enclosure 7 so that a closed space (called the first space hereunder) formed by the inner wall surfaces of the first enclosure 7, the outer wall surfaces of the second enclosure, and the diaphragm 10 can be evacuated. The diaphragm 10 is provided to keep the pressure of the second space higher than that of the first space 11. This allows the second embodiment to keep the second space isolated in terms of pressure. That is, the diaphragm 10 keeps the first space 11 in a high-vacuum state, while the second space 12 is maintained in a gas atmosphere at atmospheric pressure or at a pressure approximately equal thereto. Thus during operation of the apparatus, the charged particle optical tube 2 and the detector 3 can be kept in the vacuum state and the sample 6 can be maintained at atmospheric pressure. Furthermore, because the second enclosure 121 is provided with the open side, the sample 6 can be freely replaced during observation.

The upper surface side of the second enclosure 121 is provided with the diaphragm 10 that is positioned immediately under the charged particle optical tube 2 when the entire second enclosure 121 is fit into the first enclosure 7. The diaphragm 10 allows the primary charged particle beam discharged from the lower end of the charged particle optical tube 2 to permeate or pass therethrough. Past the diaphragm 10, the primary charged particle beam ultimately reaches the sample 6.

As explained above, installing the attachment including the diaphragm enables the ordinary vacuum charged particle beam apparatus to permit observation of the sample at atmospheric pressure or in a gas atmosphere. Furthermore, the above-mentioned liquid inlet mechanism allows the sample to be observed at atmospheric pressure, in a gas atmosphere, or in a moistened state. Also, because the attachment of the second embodiment is inserted laterally into the sample chamber, the attachment is easy to manufacture in a large size.

<About the Parts for Fixing the Diaphragm>

The base 159 fitted with the diaphragm 10 is mounted on the diaphragm holding member 155. The diaphragm holding member 155 is attached to the second enclosure 121. The clearance between the diaphragm holding member 155 and the second enclosure 121 is vacuum-sealed with a vacuum seal 124 such as an O-ring or packing. Although not shown, the base 159 furnished with the diaphragm 10 and the diaphragm holding member 155 are bonded or snugly fit together with an adhesive or double-sided tape capable of vacuum sealing.

The diaphragm holding member 155 is detachably fixed to the upper surface side of the second enclosure 121, or more specifically, to the lower surface side of a ceiling board with a vacuum sealing member interposed therebetween. The diaphragm 10 is made as thin as several nm to tens of μm in view of the requirement that the electron beam be allowed to permeate therethrough. Being formed very thin, the diaphragm 10 can break over time or during preparation of observation. Also, the diaphragm 10 is so thin that it is very difficult to handle directly. Because this embodiment allows the base 159 fitted with the diaphragm 10 to be handled not directly but by means of the diaphragm holding member 155, it is appreciably easy to deal with the diaphragm 10 (especially its replacement). That is, when the diaphragm 10 is broken, it may be replaced altogether with the diaphragm holding member 155. In case only the diaphragm 10 needs to be replaced, the diaphragm holding member 155 may be first detached from the apparatus and then the diaphragm 10 may be replaced outside the apparatus. As with the first embodiment, in place of the diaphragm, there may be provided an aperture member having a hole 1 mm$^2$ or less in area.

When the inside of the first enclosure is in a vacuum state, the diaphragm holding member 155 is attracted to the vacuum so that it is stuck to the second enclosure 121 and will not fall. Also, if a fall prevention member 203 or like part is interposed between the second enclosure 121 and the diaphragm holding member 155, the diaphragm holding member 155 can be prevented from falling when the inside of the first enclosure is at atmospheric pressure.

<About Position Adjustment of the Diaphragm>

Explained next is a position adjustment mechanism for the diaphragm 10. In some cases, the optical axis 200 of the charged particle optical tube 2 (i.e., image center) may be misaligned with the position of the diaphragm 10 when a member fitted with the diaphragm is attached to the second enclosure 121. If the image obtained with the charged particle microscope is not centered substantially, the diaphragm 10 and the sample 6 may not be observed when the magnification of the charged particle beam image is changed from low to high. This requires roughly aligning the optical axis 200 of the charged particle optical tube 2 with a diaphragm center 201. In the ensuing paragraphs, the position of the optical axis 200 of the charged particle optical tube 2 is assumed to be fixed.

To align the optical axis 200 of the charged particle optical tube 2 with the position of the diaphragm 10, a diaphragm position adjustment mechanism 259 is used, which can adjust the diaphragm position. FIG. 8 shows a structure in which the adjustment mechanism 259 is located on the open side of the second enclosure 121. For example, with its knob suitably turned, the adjustment mechanism 259 pushes or pulls the diaphragm 10 to adjust the diaphragm position. The drive mechanism 259 is secured to the second enclosure 121 by means of a support part 261. In the drawing, only one adjustment mechanism 259 is shown. Since the diaphragm also needs to be moved in the depth direction of the drawing, at least two adjustment mechanisms 259 are required.

When the drive mechanisms 259 are operated, the diaphragm holding member 155 fitted with the diaphragm 10 and base 159 is adjusted accordingly in position. Upon position change, the diaphragm holding member 155 is moved in sliding fashion over the vacuum seal 124. The diaphragm holding member 155 may also be driven along rails, guides or the like, not shown.

Alternatively, a member (not shown) for making contact with the diaphragm holding member 155 may be mounted on the sample stage 5, and the diaphragm holding member 155 may be moved by use of the sample stage 5. That is, the above-mentioned member is first placed on the sample stage 5. By use of the operation part 204, the member is brought into contact with the diaphragm holding member 155 for example. Then the sample stage 5 is used to move the diaphragm holding member 155 in the Y and Y directions, so that the position of the diaphragm 10 can be changed. In this case, there should be a sufficient frictional force between the member and the diaphragm holding member 155 so as to drive the diaphragm holding member 155 crosswise and in the depth direction in the drawing.

<About the Sample Stage>

Inside the second enclosure 121, there is provided the sample stage 5 on which the sample is placed and which can be changed in position. The sample stage 5 has an X-Y drive mechanism for movement in the plane direction and a Z-axis drive mechanism for movement in the height direction. Also in the second enclosure, there is provided a stage support base 17 serving as the base plate for supporting the sample stage 5. The sample stage 5 is mounted on the stage support base 17. The Z-axis drive mechanism and X-Y drive mechanism are installed inside the second enclosure. The apparatus user adjusts the position of the sample 6 in the second enclosure 121 by manipulating the operation knob 204 and other controls. Although shown inside the second enclosure in the drawing, the operation knob 204 may also be pulled out of the apparatus for use or may be controlled from the outside using an electric motor or the like. If the stage is too large or bulky to be completely accommodated inside the second enclosure 121, at least part of the drive mechanisms including the stage need only be located in the second enclosure 121.

<Liquid or Gas Inlet-Outlet Part>

Explained next is the liquid inlet-outlet part 300 capable of bringing liquid to the sample. Inside the second enclosure 121, there is provided the liquid inlet-outlet part 300 having the aperture 301 positioned under the sample on the sample stage 5. As discussed above, the liquid or gas brought in or out through the liquid inlet-outlet part 300 is transmitted to the sample 6 via the liquid transmission member 302. The liquid transmission member 302 may be fixed to the sample stage 5 or onto the second enclosure 121 using, say, a metal member, an adhesive or a tape, not shown. The sample 6 may also be fixed onto the liquid transmission member 302 by use of some suitable member. The liquid inlet-outlet part 300 is structured and used in the same manner as in the first embodiment. Installation of the liquid transmission member 302 is optional. The liquid leak prevention part 308, liquid absorption member 309, temperature control part 305, and electrodes 307 may be attached in the same manner as in the first embodiment. As with the first embodiment, a gas, not liquid, may be brought in and out through the liquid inlet-outlet part 300.

The foregoing paragraphs have explained the liquid inlet-outlet part 300 inside the second enclosure 121 of the second embodiment. The location and the method of installation of the liquid inlet-outlet part 300 may be other than those explained above. Such locations and installation methods fall within the scope of the SEM or charged particle beam apparatus of the second embodiment as long as the functions intended by this embodiment are satisfied.

Third Embodiment

Figure 9:
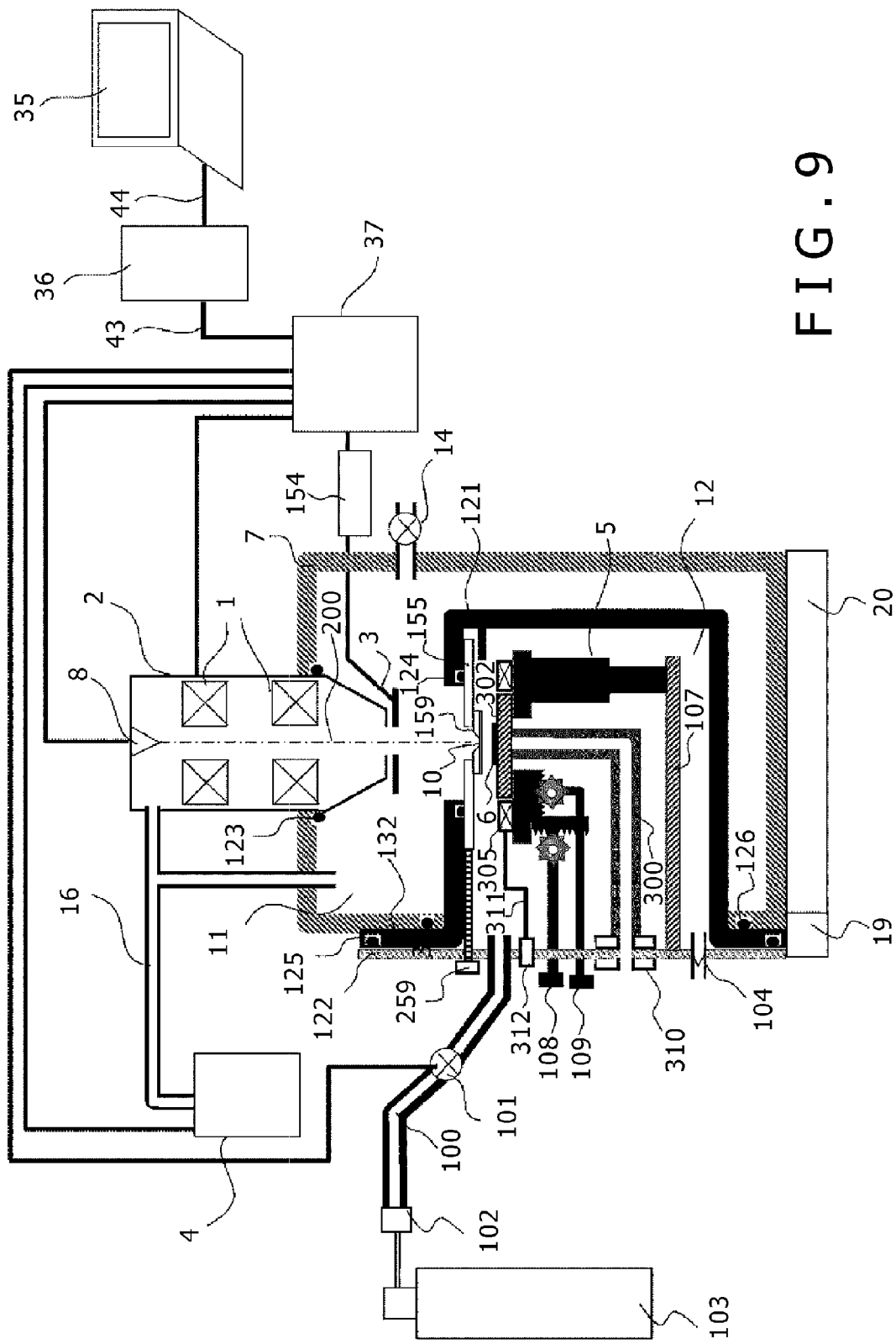
FIG. 9 is an overall block diagram of a charged particle microscope as a third embodiment of the present invention.

FIG. 9 is an overall block diagram of a charged particle microscope as the third embodiment. As with the first and the second embodiments, the charged particle microscope of the third embodiment is made up of a charged particle optical tube 2, a first enclosure (vacuum chamber) 7 that supports the charged particle optical tube against an apparatus installation surface, a second enclosure (attachment) 121 inserted into the first enclosure 7 when used, and a control system. The operations and functions of these components as well as the elements added thereto are substantially the same as those of the first and the second embodiments and thus will not be discussed further in detail.

In the case of the charged particle microscope as the third embodiment, an open side constituting at least one of the sides of the second enclosure 121 can be covered with a cover part 122, so that various functions may be implemented. These functions are explained below.

<About the Atmosphere Near the Sample>

The charged particle microscope of the third embodiment has the function of feeding a shift gas into the second enclosure or the function of forming a pressure state different from the atmosphere in the first space 11 or outside the apparatus. The charged particle beam discharged from the lower end of the charged particle optical tube 2 passes through the first space maintained in a high-vacuum state to permeate the diaphragm 10 shown in FIG. 9, before entering the second space kept at atmospheric pressure or at a negative pressure (lower than the pressure of the first space). That is, the second space has a worse (i.e., lower) degree of vacuum than the first space. In the atmospheric space, an electron beam is scattered by gas molecules so that its mean free path becomes shorter. That is, a long distance between the diaphragm and the sample 6 can prevent the charged particle beam, or the secondary electrons, reflected electrons, or transmission electrons generated by the emitted charged particle beam from reaching the sample or the detectors 3 and 151. Meanwhile, the scattering probability of the electron beam is proportional to the mass number and density of gas molecules. Thus if the second space is filled with gas molecules having a smaller mass number than the air or if the second space is slightly evacuated, the scattering probability of the electron beam declines and the electron beam can reach the sample. The second space need not be entirely filled with a shift gas; at least the air along the passing path of the electron beam in the second space, i.e., in a space between the diaphragm and the sample, need only be replaced with the shift gas.

For the above reasons, the charged particle microscope of the third embodiment has the cover part 122 including an attaching part (gas introduction part) for a gas feed pipe 100. The gas feed pipe 100 is coupled to a gas cylinder 103 via a coupling portion 102, which allows the shift gas to be introduced into the second space 12. Halfway along the gas feed pipe 100, there is provided a gas control valve 101 that controls the flow rate of the shift gas flowing through the pipe. For control purposes, a signal line is extended from the gas control valve 101 to the slave control unit 37. The apparatus user can control the flow rate of the shift gas through an operation screen displayed on the monitor of a computer 35. Alternatively, the gas control valve 101 may be opened and closed manually.

Varieties of the shift gas include nitrogen and water vapor, which are lighter than the air and prove to be effective in improving the S/N ratio of images. However, a gas with a smaller mass such as helium gas or hydrogen gas is more effective in improving the image S/N ratio.

Since the shift gas is a light element gas, it tends to stay in the upper region of the second space 12; it is difficult to fill the lower region of the second space 12 with the shift gas. This bottleneck may be bypassed by providing the cover part 122 with an opening for communicating the inside and the outside of the second space at a location lower than the mounting position of the gas feed pipe 100. In FIG. 9, for example, the opening is provided in the location to which a pressure regulating valve 104 is attached. This arrangement causes the atmospheric gas to be discharged from the lower side opening under pressure of the light element gas introduced through the gas introduction part, so that the second enclosure 121 is filled with the gas efficiently. Incidentally, this opening may double as a rough exhaust port, to be discussed later.

In place of the opening above, the pressure regulating valve 104 may be provided. The pressure regulating valve 104 has the function of automatically opening if the pressure inside the second enclosure 121 becomes higher than atmospheric pressure. If the internal pressure gets higher than atmospheric pressure during introduction of a light element gas, the pressure regulating valve having this function automatically opens to release the atmospheric gas components such as nitrogen and oxygen into the outside of the apparatus and thereby fill the inside of the apparatus with the light element gas. Incidentally, the gas cylinder or vacuum pump 103 shown in the drawing may be attached to the charged particle microscope either during manufacturing or later by the apparatus user.

Even if the light element gas such as helium gas or hydrogen gas is used, there may be significant scattering of the electron beam therein. In such a case, the gas cylinder 103 may be replaced with a vacuum pump. Then the inside of the second enclosure is slightly evacuated, which can bring about a very low vacuum state (i.e., an atmosphere at a pressure close to atmospheric pressure) in the second enclosure. For example, an evacuation port provided on the second enclosure 121 or on the cover part 122 may be used to evacuate slightly the inside of the second enclosure 121 first. Then the shift gas may be introduced into the second enclosure 121. In this case, high-vacuum evacuation is not needed; low-vacuum evacuation is sufficient for lowering the atmospheric gas components remaining inside the second enclosure 121 to a predetermined level or less.

However, if the sample is a biological sample or the like that contains moisture, the contained moisture evaporates once the sample is placed in a vacuum state so that the state of the sample is changed. In this case, the shift gas should preferably be introduced directly from the air atmosphere as explained above. When the above-mentioned opening is closed with the cover part following introduction of the shift gas, the shift gas may be effectively contained within the second space.

With the third embodiment, as explained above, it is possible to control the space in which the sample is placed to desired degrees of vacuum ranging from atmospheric pressure (about $10^5$ Pa) to about $10^3$ Pa. In the ordinary, so-called low-vacuum scanning electron microscope, the electron beam column communicates with the sample chamber. It follows that lowering the degree of vacuum in the sample chamber close to atmospheric pressure entails varying the pressure inside the electron beam column correspondingly. It has thus been difficult to control the sample chamber to pressures ranging from atmospheric pressure (about $10^5$ Pa) to about $10^3$ Pa. According to the third embodiment, by contrast, the diaphragm isolates the second space from the first space, so that the pressure and type of the gas in the second space enclosed by the second enclosure 121 and cover part 122 can be freely controlled. This makes it possible to control the sample chamber to pressures ranging from atmospheric pressure (about $10^5$ Pa) to about $10^3$ Pa—something that has been difficult to achieve in the past. Moreover, the state of the sample can be observed not only at atmospheric pressure (about $10^5$ Pa) but also under continuously varying pressures close thereto.

It may also be desired to observe the chemical reaction process of the sample surface. In such a case, the cylinder 103 may be one that contains a reactive gas such as an organic gas, oxygen gas, or an inorganic gas. Although not shown, the cylinder 103 may constitute a composite gas control unit that combines a gas cylinder with a vacuum pump.

<About the Sample Stage>

The sample stage 5 is explained next. The charged particle microscope of the third embodiment has the sample stage 5 as a means for moving the field of observation by deflecting the sample position. The sample stage 5 is provided with an X-Y drive mechanism for movement in the plane direction and a Z-axis drive mechanism for movement in the height direction. The cover part 122 is furnished with a support plate 107 that serves as the base plate for supporting the sample stage 5. The sample stage 5 is fixed to the support plate 107. The support plate 107 is installed in such a manner as to extend toward the opposite surface of the second enclosure 121 from the cover part 122 and into the inside of the second enclosure 121. Support shafts extend from the X-axis drive mechanism and X-Y drive mechanism, each of the shafts being coupled with operation knobs 108 and 109 that belong to the cover part 122. By manipulating the operation knobs 108 and 109, the apparatus user adjusts the position of the sample 6 inside the second enclosure 121.

<Liquid or Gas Inlet-Outlet Part>

As with the preceding embodiments, the liquid inlet-outlet part 300 is installed around the sample stage 5 and close to the sample 6. The liquid inlet-outlet part 300 is connected to the cover part 122. Mounting a coupling part 310 on the cover part 122 makes it easier to install a liquid inlet-outlet control part such as a liquid inlet-outlet pump or a syringe from outside the apparatus. Although not shown, the liquid leak prevention part 308 may also be provided as in the preceding embodiments so that liquid will not spill into the second enclosure.

As with the first embodiment, a gas, not liquid, may be brought in and out through the liquid inlet-outlet part 300. If the gas is to be brought in and out, the gas feed pipe 100 attached to the above-mentioned cover part 122 may or may not be provided.

<Voltage Impression Part>

The third embodiment may also be provided with a temperature heater or a Peltier device capable of controlling the temperature near the sample 6 or the temperature of the liquid. In the drawing, the temperature control part 305 is shown installed in the second enclosure 121. The temperature control part is connected with wiring 311 that comes from a signal inlet-outlet part 312 coupled to the cover part 122. With this structure in place, the temperature around the sample 6 or the temperature of the liquid to be introduced can be controlled from outside the apparatus by way of the signal inlet-outlet part 312. A thermometer or like part, not shown, may also be installed. Also, a voltage may be impressed on the sample 6 by having the electrodes 307 connected with the signal inlet-outlet part 312 coupled to the cover part 122.

Compared with the preceding embodiments, the third embodiment is characterized in that the space 12 inside the second enclosure is closed. This makes it possible to bring a reactive gas or liquid to the sample 6 and to observe the state of a temperature-controlled sample with the charged particle beam apparatus.

<About Replacement of the Sample>

Figure 10:
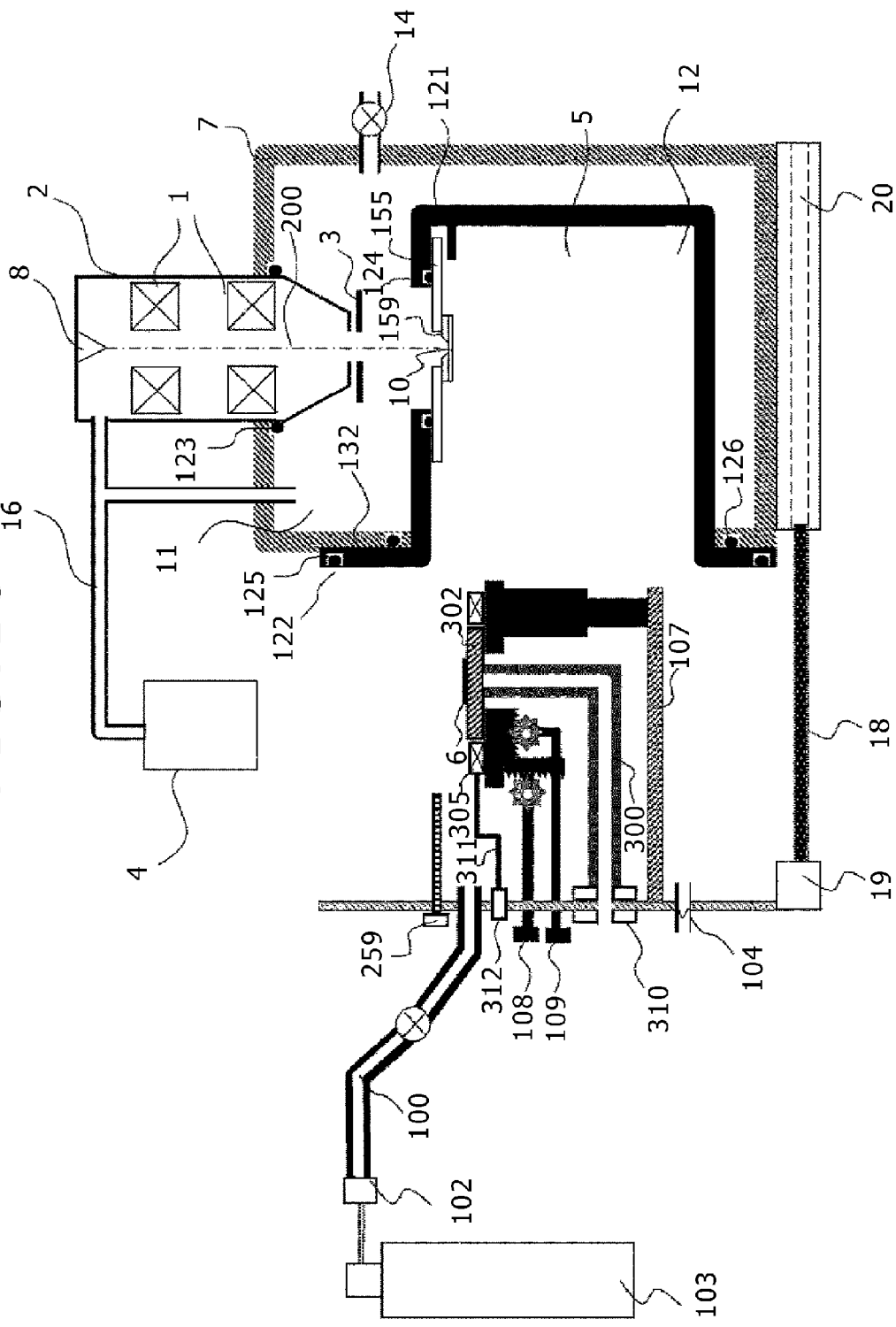
FIG. 10 is a diagram showing a sample stage being pulled out of the charged particle microscope as the third embodiment.

The mechanisms for replacing the sample 6 are explained next. The charged particle microscope of the third embodiment has a cover part support member 19 and a base plate 20 installed under the bottom of the first enclosure 7 and under the lower surface of the cover part 122. The cover part 122 is detachably fixed to the second enclosure 121 with a vacuum sealing member 125 interposed therebetween. The cover part support member 19 is also fixed detachably to the base plate 20. As shown in FIG. 10, the cover part 122 and cover part support member 19 can be detached as a whole from the second enclosure 121. In the drawing, electrical wiring is not shown.

The base plate 20 is provided with a support rod 18 for use as a guide upon removal. In the normal state of observation, the support rod 18 is housed in a storage part of the base plate 20. The support rod 18 is structured to extend in the direction in which the cover part 122 is drawn out for removal. Also, the support rod 18 is fixed to the cover part support member 19 so that when the cover part 122 is removed from the second enclosure 121, the cover part 122 will not be completely detached from the body of the charged particle microscope. This arrangement is intended to prevent the sample stage 5 or the sample 6 from falling.

When the sample is to be brought into or out of the second enclosure 121, the operation knob for the Z-axis of the sample stage 5 is first operated to move the sample 6 away from the diaphragm 10. The pressure regulating valve 104 is then opened to expose the inside of the second enclosure to the atmosphere. Thereafter, following the verification that the inside of the second enclosure is neither in a negative pressure state nor in an inordinately pressured state, the cover part 122 is pulled out to the opposite side of the apparatus body. After the sample is replaced, the cover part 122 is pushed into the second enclosure 121. With the cover part 122 fixed to the matching unit 132 using a fastening member, not shown, the inside of the second enclosure 121 is filled with a shift gas or evacuated as needed. The above operations may be carried out while a high voltage is being applied to the optical lens 1 in the charged particle optical tube 2 or the charged particle beam is being emitted from the charged particle source 8. That is, the operations may be performed while the charged particle optical tube 2 is continuously in operation and while the first space is kept in the vacuum state. The charged particle microscope of the third embodiment thus permits observation to be started quickly after the sample is replaced.

<Positional Relation Markings>

Since the present invention involves forming a differential pressure between the atmospheric pressure and a vacuum, the area of the diaphragm is required to be very small. For this reason, after the sample 6 is replaced while the cover part 122 is being pulled out as shown in FIG. 10, there is a possibility that no sample may be found under the diaphragm 10 when the cover part 122 is pushed into the second enclosure 121. What follows is thus an explanation of marking parts for ascertaining the positional relations between the position of sample observation and the diaphragm position. For the ensuing description, it is assumed that the position of the diaphragm 10 and the optical axis 200 of the charged particle optical tube 2 are aligned with each other by means of the adjustment mechanisms 259, for example.

Figure 11:
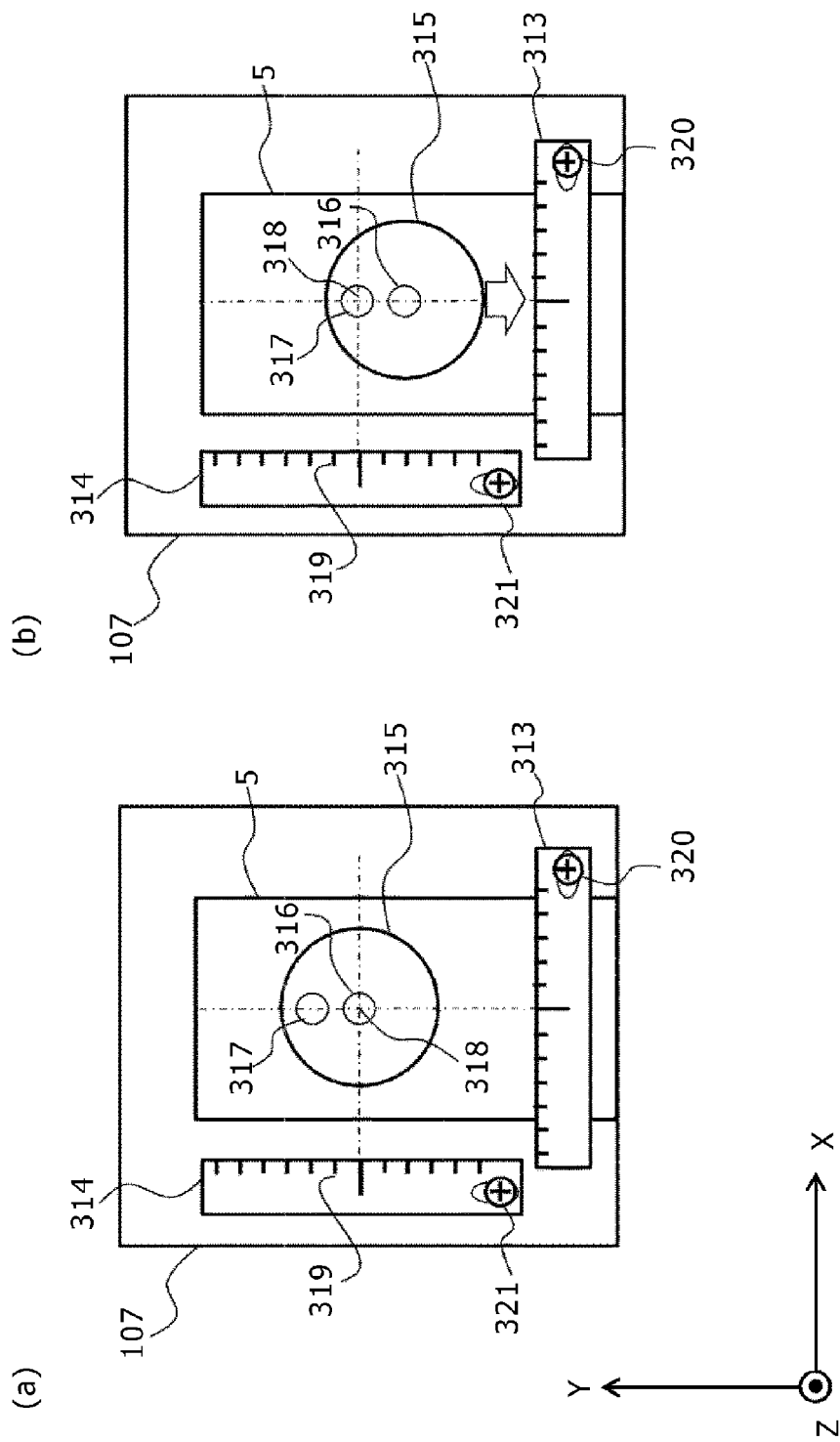
FIGS. 11A and 11B are sets of explanatory diagrams showing the surroundings of a sample stage 5.

FIG. 11 shows only the sample stage as viewed from the upper part in FIG. 10 while the cover part 122 is being pulled out. The sample stage 5 is mounted on the support plate 107. A sample holder 315 (or liquid absorption member 309) and the sample are placed on the sample stage 5. On the support plate 107, an X-direction marking part 313 and a Y-direction marking part 314 are provided. A desired observation sample 316 is placed at a marked center position 318 ascertained by the X-direction marking part 313 and Y-direction marking part 314 (i.e., at the point of intersection between dashed lines in the drawings). It is assumed that the marked center position 318 has been adjusted so as to come under the center of the diaphragm 10 when the cover part 122 is pushed into the second enclosure, as will be discussed later. It is also assumed that the center of the diaphragm 10 was positioned beforehand on the optical axis of the charged particle optical tube. Consequently, the marked center position 318 may be said to be indicative of that position of the sample stage which is aligned with the optical axis. This makes it possible to ascertain a specific location on the sample holder (or on the liquid absorption member 309) on which the sample may be placed in a manner coming under the diaphragm 10 while the cover part 122 is being pulled out.

A method of operation for viewing another observation sample 317 is explained next. With the cover part 122 pulled out, the stage 5 is moved so that the observation sample 317 comes to the marked center position 318 as shown in FIG. 11(b). Thereafter, the cover part 122 is pushed back into the second enclosure, which allows the observation sample 317 to be observed.

Graduations 319 provided on the X-direction marking part 313 and Y-direction marking part 314 allow the positional relation and the distance between the observation samples 316 and 317 to be known. In this case, it is possible to ascertain that after the observation sample 318 is observed, how the sample stage is to be moved to bring the observation sample 317 into position for observation. Thus with the cover part 122 kept pushed in, the sample stage may be moved only by the known graduations to permit observation of the observation sample 317.

The ensuing paragraphs will explain the method of adjusting the marked center position 318 (point of intersection between the dashed lines in the drawings) and the diaphragm position. The marked center position 318 and the position of the diaphragm 10 are adjusted upon assembly of the apparatus. For example, while the apparatus is being assembled, a sample with a known alignment mark inscribed in its center is placed on the sample holder 315. The sample holder 5 is then moved so that the alignment mark comes under the diaphragm in the charged particle apparatus. The cover part 122 is then pulled out. Following visual verification of where the alignment mark is positioned, an X-direction marking adjustment part 320 and a Y-direction marking adjustment part 321 are moved to align the marked center position 318 (point of intersection between the dashed lines in the drawings) with the position of the alignment mark. This makes it possible to align the marked center position 318 (point of intersection between the dashed lines in the drawings) with the diaphragm 10 and with the optical axis 200 of the charged particle optical tube 2 when the cover part 122 is pushed in.

The X-direction marking part 313 and Y-direction marking part 314 are mounted on the support plate 107 independently of the sample stage 5. That is, even when the sample stage 5 is moved using the operation part 108 or other controls, the X-direction marking part 313 and Y-direction marking part 314 remain unmoved. Whereas it was explained that the X-direction marking part 313 and Y-direction marking part 314 are mounted on the support plate 107, they may alternatively be provided on the cover part 122, on the second enclosure 121, or on the first enclosure 7.

Markings such as graduations, not shown, may be provided on the sample holder 315. The graduations or other markings on the sample holder 315 make it easy to ascertain how much distance lies between the center of the sample holder 315 and the sample 6.

<Observation in Vacuum>

Figure 12:
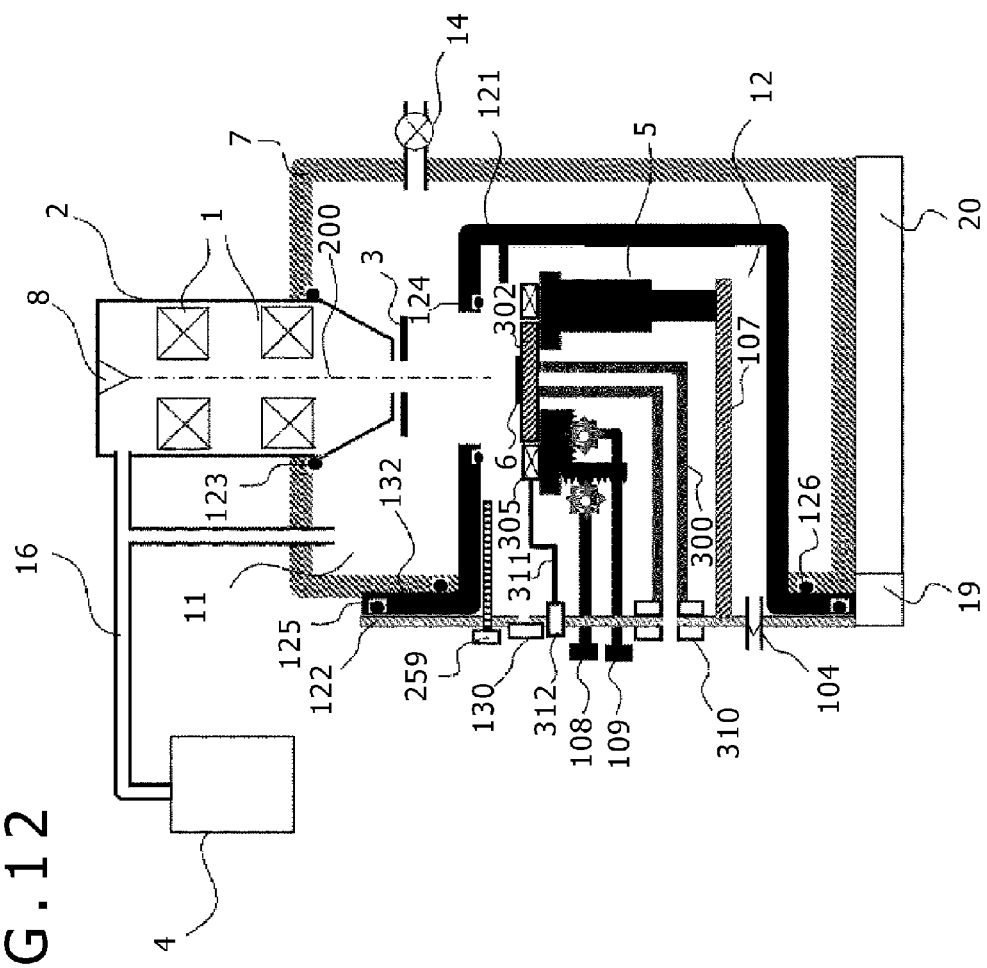
FIG. 12 is a diagram showing how observation in vacuum is performed with the charged particle microscope as the third embodiment.

The charged particle microscope of the third embodiment may also be used as an ordinary high-vacuum charged particle microscope apparatus. FIG. 12 is an overall block diagram of the charged particle microscope of the third embodiment used as a high-vacuum charged particle microscope. In FIG. 12, the control system is the same as that shown in FIG. 9 and is thus not shown. FIG. 12 shows a charged particle microscope in which, with the cover part 122 fixed to the second enclosure 121, the gas feed pipe 100 is detached from the cover part 122 and the mounting position vacated by the gas feed pipe 100 is covered with the cover part 130. After the diaphragm 10 and the diaphragm holding member 155 are detached altogether by carrying out the above series of operations, the first space 11 can be connected with the second space 12, allowing the inside of the second enclosure to be evacuated with the vacuum pump 4. This causes the inside of the second enclosure to become equal in pressure to the inside of the first enclosure so that, with the second enclosure 121 kept attached, high-vacuum charged particle microscopic observation can be made. That is, simply detaching the diaphragm 10 together with the diaphragm holding member 155 can turn the charged particle microscope apparatus for observation at atmospheric pressure or in a gas atmosphere, into a high-vacuum charged particle microscope apparatus.

It was explained above that the diaphragm 10 is detached together with the diaphragm holding member 155 so as to connect the first space 11 with the second space 12. Alternatively, an aperture member having a hole therein may be provided above the sample. This allows a slight difference in pressure between the first space 11 and the second space 12.

Upon observation in a high vacuum, the coupling part 310 connecting the liquid inlet-outlet part 300 with the cover part 122 is required to be closed. If charged particle microscopic observation is to be made not in a high vacuum but in a low vacuum, a desired liquid or gas may be introduced through the coupling part 310. For example, water, if introduced, evaporates upon reaching the liquid transmission member 302, so that water vapor may be supplied to the surroundings of the sample 6. That is, a low-vacuum state in which the surroundings of the sample are filled with water vapor may be created.

The liquid to be introduced may be water, a water solution, an organic solvent such as ethanol, or an ionic liquid. Particularly, if the ionic liquid that does not evaporate in vacuum is poured in through the liquid inlet-outlet part 300, charged particle beam observation can be made of how the sample is being saturated with the ionic liquid over time.

<Others>

As explained above, the third embodiment has the sample stage 5, sample stage operation knobs 108 and 109, gas feed pipe 100, pressure regulating valve 104, and coupling part 310 attached altogether to the cover part 122. As a result, the apparatus user can remain facing the same side of the first enclosure while manipulating the operation knobs 108 and 109 or working to replace the sample or to control the gas feed pipe 100, pressure regulating valve 104, and liquid inlet and outlet. It follows that, compared with the ordinary charged particle microscope in which the above-mentioned components are mounted in a scattered manner on various sides of the sample chamber, the third embodiment offers appreciably enhanced operability.

The above-described structure may be supplemented with a contact monitor for detecting the contact condition between the second enclosure 121 and the cover part 122. This contact monitor may be used to monitor whether the second space is closed or opened.

In addition to the secondary electron detector and the reflected electron detector, there may be provided an X-ray detector and a photodetector capable of EDS analysis and fluorescence line detection. The X-ray detector and photodetector may be installed in either the first space 11 or the second space 12.

A voltage may be applied to the sample stage 5 and detector 151. Applying the voltage to the sample 6 and detector 150 gives high energy to the emission and transmission electrons emanating from the sample 6, which can increase the amount of signals and thereby improve the S/N ratio of images.

With this apparatus structure, the charged particle beam is emitted to the sample 6 while the sample 6 is positioned as close to the diaphragm 10 as possible. Such positioning can bring the sample 6 inadvertently into contact with the diaphragm 10 and damage the latter. To avoid such eventuality, there may be provided between the sample 6 and the diaphragm 10 a member for determining the distance therebetween.

As described above, the third embodiment can supplement the effects of the first and the second embodiments by introducing a shift gas starting from atmospheric pressure. This embodiment also allows the sample to be observed in an atmosphere under a pressure different from that of the first space. While permitting observation in the atmosphere or in a predetermined gas atmosphere, the third embodiment also constitutes an SEM providing observation of the sample in the same vacuum state as that of the first space.

Although the third embodiment has been explained above with emphasis on a structure intended for use as a desktop electron microscope, the third embodiment may also be applied to a large-scale charged particle microscope. Whereas the desktop electron microscope has the entire apparatus or its charged particle optical tube supported by an enclosure on an apparatus installation surface, the large-scale charged particle microscope need only have the entire apparatus placed on a frame. Thus when the first enclosure 7 is placed on the frame, the structure discussed above in connection with the third embodiment can be applied unmodified to the large-scale charged particle microscope.

Fourth Embodiment

Figure 13:
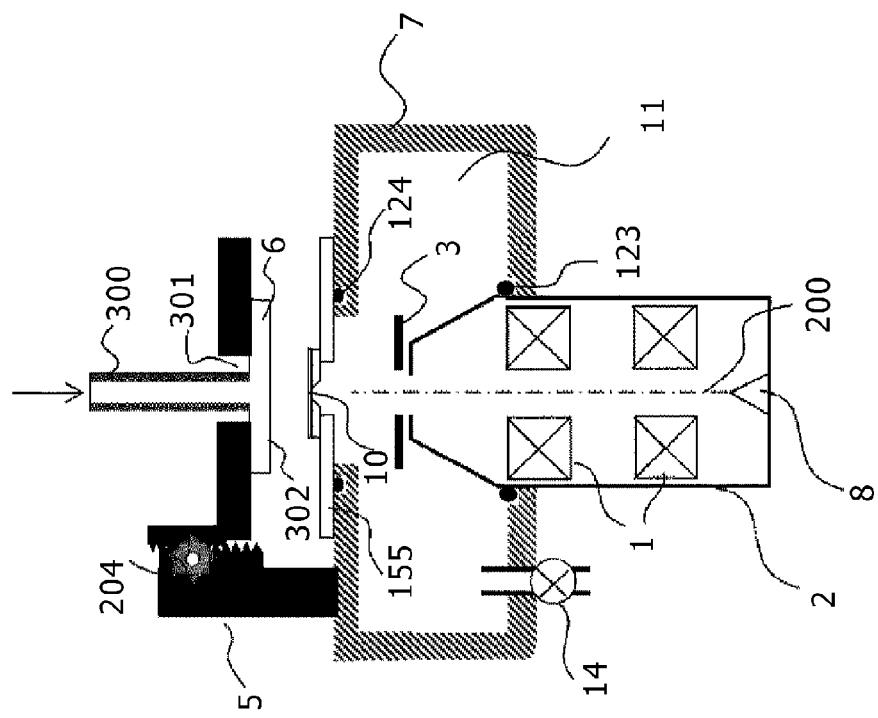
FIG. 13 is a diagram explaining a typical structure of a charged particle microscope as a fourth embodiment of the present invention.

The fourth embodiment is explained below in terms of a structure as a variation of the first embodiment, the structure being one in which the charged particle optical tube 2 is located under the diaphragm 10. FIG. 13 is a block diagram of the charged particle microscope as the fourth embodiment. The vacuum pump and control system are not shown in the drawing. It is assumed that the enclosure 7 (vacuum chamber) and the charged particle optical tube 2 are supported against the apparatus installation surface using columns and props. The operations and functions of the components involved as well as the elements added thereto are substantially the same as those of the preceding embodiments and thus will not be discussed further in detail.

The sample stage 5 for keeping the sample 6 out of contact with the diaphragm 10 is provided over the diaphragm. That is, the lower surface of the sample 6 as seen in the drawing is to be observed. The operation part 204 for operating the sample stage 5 may be used to bring the lower surface of the sample close to the diaphragm 10.

The liquid inlet-outlet part 300 is provided on the upper side in the drawing. When a liquid is brought in and out as indicated by an arrow in the drawing, the liquid can be brought in and out with regard to the sample surface opposite to the diaphragm 10. The liquid transmission member 302, not shown in the drawing, may also be used.

The present invention is not limited to the embodiments discussed above and may also be implemented in diverse variations. The embodiments above have been explained as detailed examples helping this invention to be better understood. The present invention, when embodied, is not necessarily limited to any embodiment that includes all the structures described above. Part of the structure of one embodiment may be replaced with the structure of another embodiment. The structure of a given embodiment may be supplemented with the structure of another embodiment. Part of the structure of each embodiment may be supplemented with, emptied of, or replaced by another structure. The above-described structures, functions, processing units, and processing means may be implemented partially or entirely by hardware through integrated circuit design, for example. Also, the above-described structures and functions may be implemented by software in the form of programs which, when interpreted and executed by a processor, bring about the respective functionality.

The programs, tables, files, and other data for implementing the functions may be stored in storage devices such as memories, hard disks and SSD (Solid State Drive), or on recording media such as IC cards, SD cards and DVDs. The illustrated control lines and data lines are those considered necessary for purpose of explanation and may not represent all control lines and data lines needed in the apparatus as a product. In practice, almost all structures may be considered to be interconnected.

DESCRIPTION OF REFERENCE CHARACTERS

1: Optical lens
2: Charged particle optical tube
3: Detector
4: Vacuum pump
5: Sample stage
6: Sample
7: First enclosure
8: Charged particle source
9: Open side
10: Diaphragm
11: First space
12: Second space
14: Leak valve
16: Vacuum piping
17: Stage support base
18: Support rod
19: Cover part support member
20: Base plate
35: Computer
36: Master control unit
37: Slave control unit 43, 44, 45: Communication line
100: Gas feed pipe
101: Gas control valve
102: Coupling portion
103: Gas cylinder or vacuum pump
104: Pressure regulating valve
107: Support plate
108, 109: Operation knob
121: Second enclosure
122, 130: Cover part
123, 124, 125, 126, 128, 129: Vacuum sealing member
131: Main unit
132: Matching unit
154: Signal amplifier
155: Diaphragm holding member
156, 157, 158: Communication line
159: Base
200: Optical axis of charged particle beam
201: Central axis of diaphragm
203: Fall prevention member
204: Sample position operation knob
270: Base
300: Liquid inlet-outlet port
301: Aperture
302: Liquid transmission member
303: Nozzle
305: Temperature control part
306: Tank
307: Electrode
308: Liquid leak prevention part
309: Liquid absorption member
310: Coupling part
311: Wiring
312: Signal inlet-outlet part
313: X-direction marking part
314: Y-direction marking part
315: Sample holder
316: Observation sample
317: Observation sample
318: Marked center position
319: Graduations
320: X-direction marking adjustment part
321: Y-direction marking adjustment part

The invention claimed is:

1. A charged particle beam apparatus having a charged particle optical tube for emitting a primary charged particle beam to a sample, and a vacuum pump, the charged particle beam apparatus comprising:
 an enclosure that makes up part of the charged particle beam apparatus, the inside of the enclosure being evacuated by the vacuum pump;
 a diaphragm that isolates a space in which the sample is placed so that the pressure of the space is kept higher than that of the inside of the enclosure, the diaphragm being detachable and allowing the primary charged particle beam to permeate or pass therethrough;
 a sample stage that allows the sample to approach the diaphragm; and
 an inlet-outlet part that brings in and out a desired liquid or gas in the direction of the underside or the side of the sample, wherein
 the sample remains out of contact with the diaphragm when irradiated with the primary charged particle beam.

2. The charged particle beam apparatus according to claim 1, further comprising:
 a first enclosure that makes up part of the charged particle beam apparatus, the inside of the first enclosure being evacuated by the vacuum pump; and
 a second enclosure of which the position is fixed to a side or an inner wall surface of the first enclosure or to the charged particle optical tube, the second enclosure holding the sample internally, wherein:
 the diaphragm is located on the upper surface side of the second enclosure;
 the pressure inside the second enclosure is kept equal to or higher than the pressure inside the first enclosure; and
 the inlet-outlet part is located inside the second enclosure.

3. The charged particle beam apparatus according to claim 2, further comprising an inlet-outlet port for the liquid or the gas as part of the inlet-outlet part, the inlet-outlet port being located below the surface of the sample to which the primary charged particle beam is emitted.

4. The charged particle beam apparatus according to claim 2, further comprising a cover part that makes up at least one side of the space in which the sample is placed, wherein
 the cover part includes at least part of a sample stage for changing the position of the sample, and/or a coupling part that serves as a connecting port of the inlet-outlet part.

5. The charged particle beam apparatus according to claim 1, further comprising a transmission member that permits transmission of the liquid or the gas therethrough between the inlet-outlet part and the sample.

6. The charged particle beam apparatus according to claim 5, wherein the transmission member has at least one hole formed therein.

7. The charged particle beam apparatus according to claim 5, wherein the transmission member is made of a fibrous material, a porous body, or a multitubular body having numerous tubes.

8. The charged particle beam apparatus according to claim 1, wherein at least part of the inlet-outlet part is fixed to a sample platform or to a sample stage for changing the position of the sample.

9. The charged particle beam apparatus according to claim 1, wherein the flow rate, the speed, or the timing of the liquid or the gas being brought in and out through the inlet-outlet part is allowed to be controlled.

10. The charged particle beam apparatus according to claim 1, further comprising a liquid leak prevention part that prevents the liquid brought in and out through the inlet-outlet part from leaking to locations other than those desired.

11. The charged particle beam apparatus according to claim 1, further comprising a liquid absorption member installed near the diaphragm, the liquid absorption member absorbing the liquid brought in and out through the inlet-outlet part.

12. The charged particle beam apparatus according to claim 1, wherein at least the surface of the diaphragm facing the sample is made of a hydrophobic material.

13. The charged particle beam apparatus according to claim 1, further comprising a temperature control part that controls the temperature of the liquid or the gas brought in and out through the inlet-outlet part.

14. The charged particle beam apparatus according to claim 1, further comprising electrodes that impress a voltage to the sample.

15. The charged particle beam apparatus according to claim 1, further comprising a sample stage on which the sample is placed, wherein the sample stage is provided with a marking indicative of alignment with the optical axis of the charged particle optical tube.

16. The charged particle beam apparatus according to claim 15, wherein the marking is represented by movable graduations independently of the sample stage.

17. A sample observation method for observing a sample placed in an isolated space of which the pressure is kept higher than that of the inside of a charged particle optical tube by means of a detachable diaphragm for allowing a primary charged particle beam to permeate or pass therethrough, the sample being irradiated with the primary charged particle beam for observation, the sample observation method comprising the steps of:

making the sample approach the diaphragm;
   feeding a liquid or a gas to the sample in the direction of the underside or the side thereof; and
   emitting the primary charged particle beam to the sample while the sample and the diaphragm are kept out of contact with each other.

* * * * *